United States Patent [19]
Saitoh et al.

[11] Patent Number: 5,237,327
[45] Date of Patent: Aug. 17, 1993

[54] REMOTE COMMANDER

[75] Inventors: Mitsumasa Saitoh; Katsumi Kuwabara, both of Kanagawa, Japan

[73] Assignee: Sony Corporation, Tokyo, Japan

[21] Appl. No.: 791,508

[22] Filed: Nov. 14, 1991

[30] Foreign Application Priority Data

Nov. 19, 1990 [JP] Japan ................... 2-311524

[51] Int. Cl.$^5$ ............... G08C 19/12; H01H 9/26
[52] U.S. Cl. .................. 341/176; 200/5 A; 341/22
[58] Field of Search ............ 341/176, 22, 34; 340/691, 502, 331, 711–712; 200/314, 512, 5 A; 446/143

[56] References Cited

U.S. PATENT DOCUMENTS

| 3,567,893 | 3/1971 | Ernst | 200/314 |
|---|---|---|---|
| 4,092,640 | 5/1978 | Satoh | 341/34 |
| 4,365,120 | 12/1982 | Pounds | 200/5 A |
| 4,700,025 | 10/1987 | Hatayama et al. | 200/5 A |
| 4,825,209 | 4/1989 | Sasaki et al. | 341/23 X |
| 4,885,443 | 12/1989 | Simcoe et al. | 200/314 X |
| 4,897,651 | 1/1990 | DeMonte | 341/22 X |
| 5,034,602 | 7/1991 | Garcia, Jr. et al. | 340/712 X |

Primary Examiner—Jin F. Ng
Assistant Examiner—Thomas J. Mullen, Jr.
Attorney, Agent, or Firm—Lewis H. Eslinger; Jay H. Maioli

[57] ABSTRACT

A remote commander wherein a user can confirm operation of an operation key after such operation has a touch panel operating section including a display device for displaying an image of a plurality of operation keys thereon and an operation detecting device for detecting, when one of the operation keys displayed on the display device is depressed, the thus depressed operation key. Upon such detection of the depressed operation key, the display device is controlled to display part or all of a display portion of the depressed operation key in a flickering condition for a predetermined period of time after completion of such depression of the operation key. An infrared ray command signal corresponding to such depressed operation key is sent out to a remote object appliance to operate the object appliance.

2 Claims, 5 Drawing Sheets

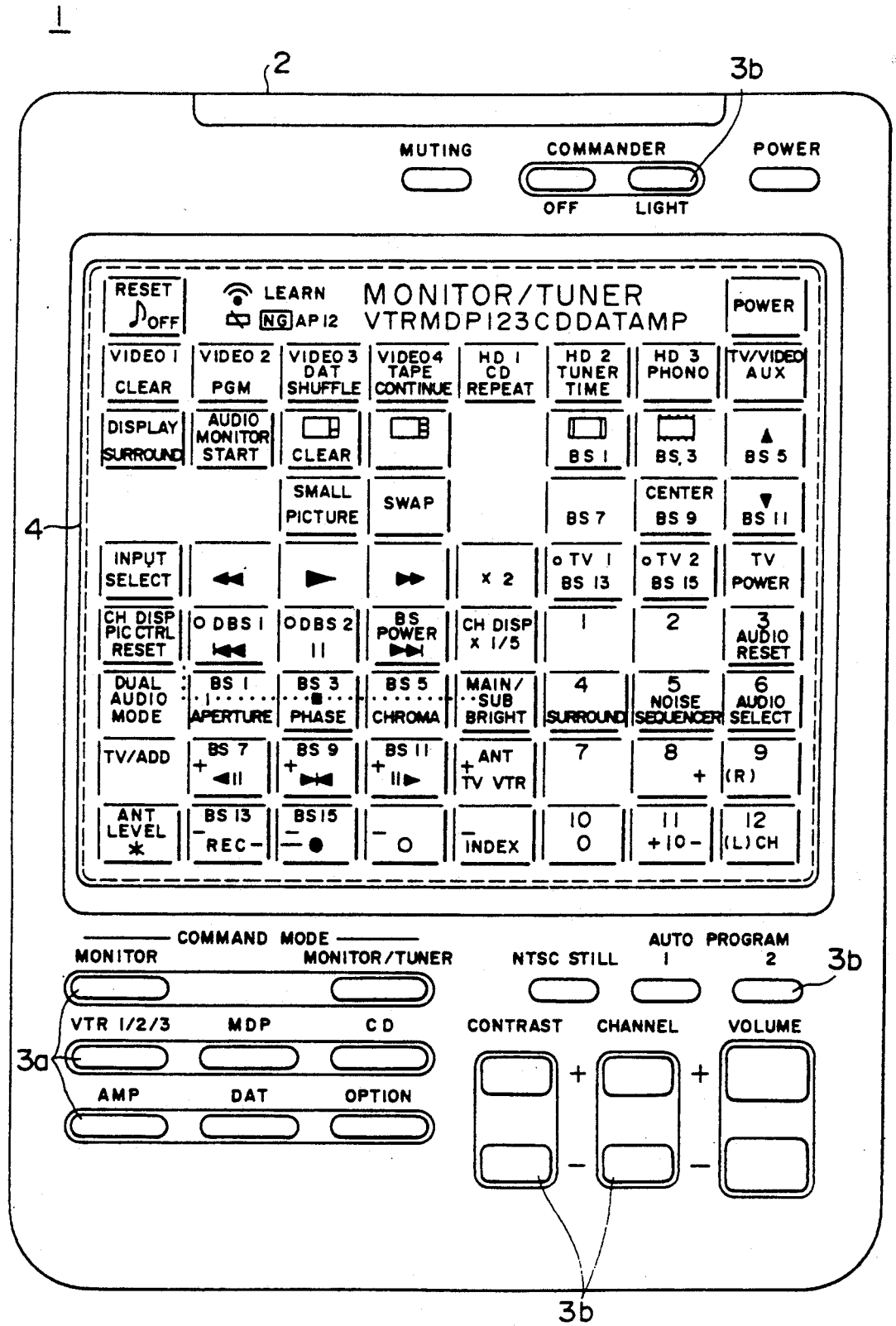

REMOTE COMMANDER

BACKGROUND OF THE INVENTION

1. Field of the Invention

This invention relates to a remote commander for use as an operating device for various electronic appliances such as a television monitor, a disk player, a video tape player and an air conditioner.

2. Description of the Prior Art

A remote commander has been put into practical use and is employed widely in recent years and is normally constructed such that a particular command signal is generated in response to depression of a key thereon and then converted into an infrared ray signal by means of, for example, a light emitting diode and such infrared ray signal is supplied to a remote electronic appliance such as a monitor unit to operate the same in a desired manner.

A plurality of operation keys are normally provided on such remote commander and constructed as a keyboard which includes a plurality of depressible keys. However, another arrangement is also known wherein a plurality of operation keys are constructed as a touch panel operating section which makes use of an LCD (liquid crystal display) display screen and touch sensors. Such touch panel operating section is normally constructed such that operation keys are displayed on an LCD display screen and if a surface of the touch panel is depressed in accordance with the displays of the operation keys, then it is detected by means of touch sensors at which location the LCD display screen is depressed and then a command signal is generated corresponding to the operation key displayed at the depressed location of the LCD display screen.

However, since the surface of such LCD display screen is flat, the operation keys provided on the LCD display screen are distinguished only based on the images displayed on the LCD display screen, and consequently, it is not easy for a user of the touch panel operating section to perform accurate operation of the operation keys.

In particular, since the operation keys of such LCD display screen have no such uneven or convex and concave profiles as do operation keys of an ordinary keyboard which includes depressible switches, it often occurs that an adjacent operation key is depressed in error. Accordingly, there is a problem that, since a user cannot confirm, after a finger has been removed from the touch panel, which operation key has just been operated, even if the electronic appliance operates in a different manner from what the user wanted to select, a cause of such operation cannot be recognized, or in some cases, various operations may take place continuously while the user does not notice the operation in error, which will result in erroneous operation of the electronic appliance.

SUMMARY OF THE INVENTION

It is an object of the present invention to provide a remote commander wherein a user can confirm operation of an operation key after such operation.

In order to attain the above object, according to the present invention, there is provided a remote commander, which comprises a touch panel operating section including a display means for displaying an image of a plurality of operation keys thereon and an operation detecting means for detecting when one of the operation keys displayed on the display means is depressed. A signal sending means sends out a signal corresponding to such depressed operation key detected by the operation detecting means to a remote object appliance, and controlling means responsive to detection of the depressed operation key by the operation detecting means controls the display means to display part or all of a display portion of the depressed operation key in a flickering condition for a predetermined period of time after completion of such depression of the operation key.

With the remote commander, when one of the operation keys displayed on the display means of the touch panel operating section is depressed, part or all of a display portion of the depressed operation key is caused to flicker for the predetermined period of time after release of the finger from the operation key. Accordingly, the user can confirm, after operation of an operation key, the thus operated operation key. Consequently, the remote commander which employs the touch panel operating section is significantly improved in case of use.

The above and other objects, features and advantages of the present invention will become apparent from the following description and the appended claims, taken in conjunction with the accompanying drawings.

BRIEF DESCRIPTION OF THE DRAWINGS

FIG. 3 is an illustration showing operation keys prepared with the touch panel operating section of the remote commander of FIG. 1;

DETAILED DESCRIPTION OF THE PREFERRED EMBODIMENT

Figure 1:
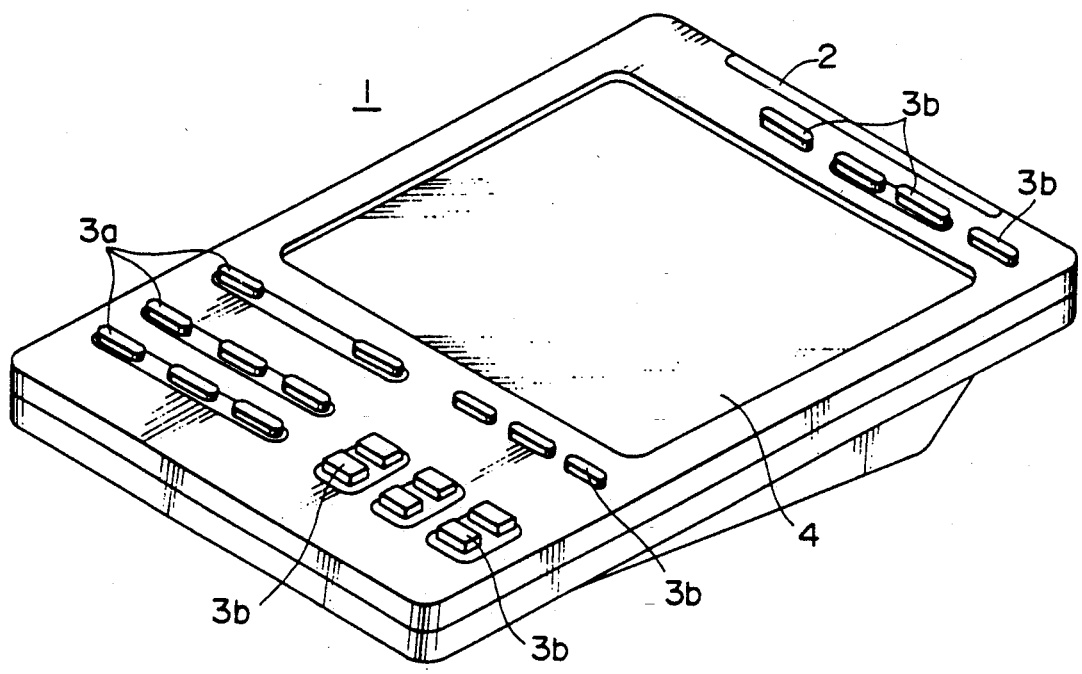
FIG. 1 is a perspective view of a remote commander showing a preferred embodiment of the present invention.

Referring to FIG. 1, there is shown a remote commander to which the present invention is applied. The remote commander shown is constructed as a remote commander for a television monitor unit, but can be adapted so as to effect remote operation of various audio/visual appliances such as a multi-disk player, a video tape recorder, a digital audio tape player, a tuner and a main amplifier.

The remote commander includes a remote commander body 1, an infrared ray sending section 2 provided on the remote commander body 1 for converting a command signal generated as an electric signal into infrared rays by means of a light emitting diode (not shown) and sending out such infrared rays, and a plurality of operation keys 3a and 3b constructed from depressible keys. The operation keys 3a serve as mode designating keys for designating an operation mode for an electronic appliance a user wants to operate while the operation keys 3b serve as operation keys used for common operation of a television monitor unit such as a power source key, sound volume keys and channel keys.

Figure 2:
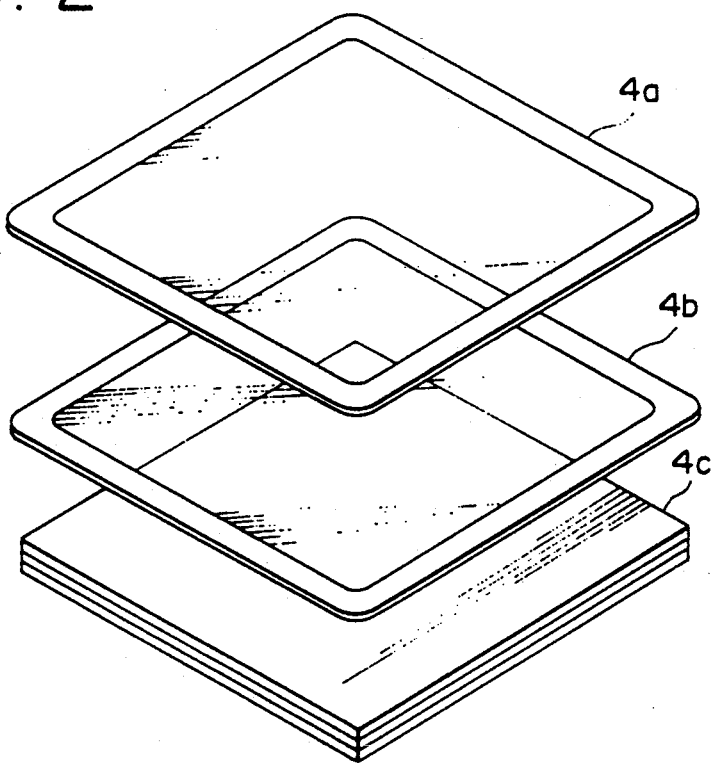
FIG. 2 is a fragmentary perspective view of a touch panel operating section of the remote commander of FIG. 1.

The remote commander further includes a touch panel operating section 4. Referring to FIG. 2, the touch panel operating section 4 includes a surface seal plate 4a, a transparent switch section 4b and a liquid crystal display (LCD) panel 4c.

The liquid crystal display panel 4c may be of a known structure wherein liquid crystal is enclosed between a pair of glass substrates and wiring layers and transparent electrodes are provided on the glass substrates. The transparent electrodes are adapted to provide displays of various symbols and include a common electrode provided on one of the glass substrates and a plurality of fixed pattern electrodes provided on the other glass substrate in an opposing relationship to the common electrode with the liquid crystal interposed therebetween and individually having patterns of predetermined symbols to be displayed.

The transparent switch section 4b has a plurality of contacts (not shown) provided thereon in a corresponding relationship to such available displays by the liquid crystal display panel 4c such that they are closed when they are selectively depressed from a surface of the touch panel operating section 4. Thus, in the remote commander of the present invention, various operation keys of a touch panel are provided by means of the liquid crystal display panel 4c serving as a display means and the transparent switch section 4b serving as an operation detecting means.

Referring now to FIG. 3, the touch panel operating section 4 of the remote commander of the present embodiment can display thereon, as symbols for displays of operation keys, frames indicating keys and various characters and figures to be displayed in such frames.

Thus, if one of the mode designating keys 3a is selectively depressed to designate a mode of a specific electronic appliance, then operation keys necessary for various operations of the specific electronic appliance are selectively displayed from among the keys prepared with the touch panel operating section 4. It is to be noted that most of the operation keys have a plurality of character sets and/or figures prepared for one key frame (for example, "VIDEO1" and "CLEAR" are prepared for a single key frame), and a suitable one of such character sets and/or figures included in each key frame is selectively displayed in accordance with a mode of a then designated electronic appliance.

Figure 4A:
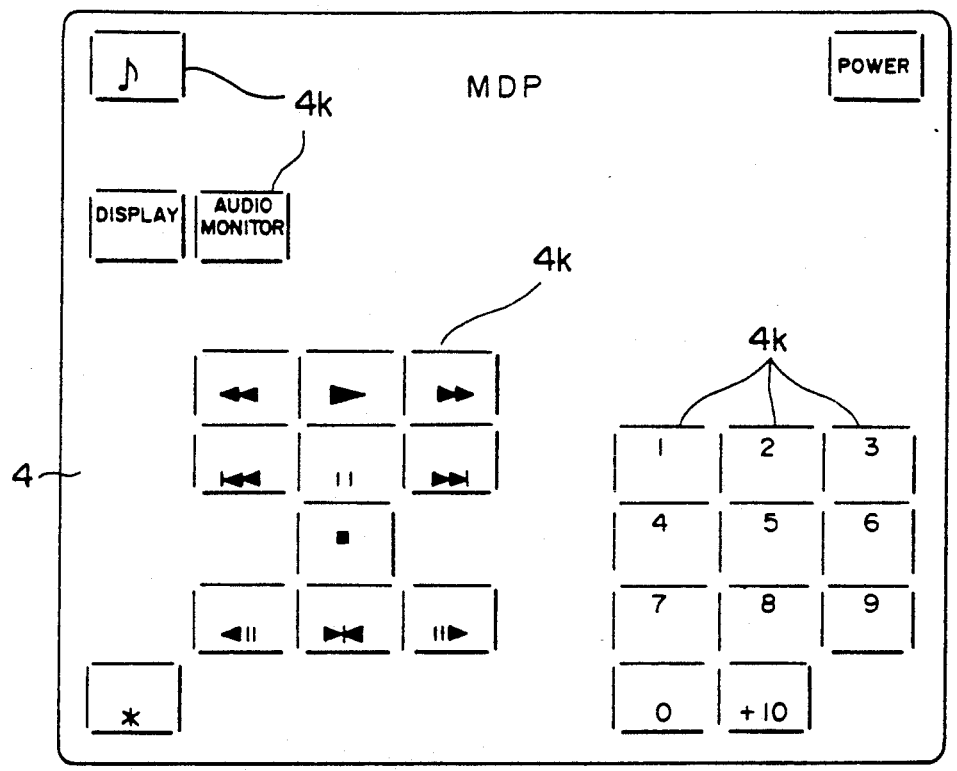
FIGS. 4(a) and 4(b) are illustrations showing different displays of operation keys of the touch panel operating section of the remote commander of FIG. 1.

For example, if an "MDP key" among the mode changing over keys 3a for designating a mode of a multi-disk player is depressed, then operation keys 4k necessary for various operations of a multi-disk player are displayed on the touch panel operating section 4 as shown in FIG. 4(a). Then, if the operation keys 4k are selectively depressed, a corresponding infrared ray command signal is sent out from the infrared ray sending section 2 to the multi-disk player.

Figure 4B:
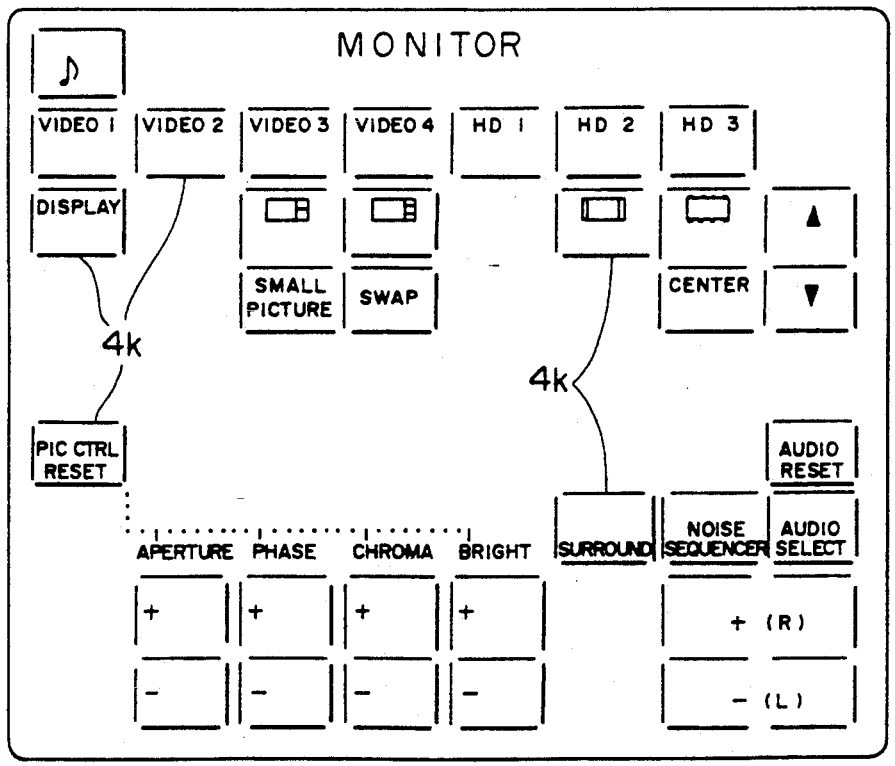

Similarly, if a "MONITOR key" among the mode changing over keys 3a for designating a mode of a television monitor unit is depressed, then operation keys 4k necessary for various operations of a television monitor unit are displayed on the touch panel operating section 4 as shown in FIG. 4(b). Then, if the operation keys 4k are selectively depressed, a corresponding infrared ray command signal for an operation of a television monitor unit is sent out from the infrared ray sending section 2 of the remote commander.

Similarly, different operation keys 4k necessary for various operations of a corresponding electronic appliance are displayed on the touch panel operating section 4 for each of a "MONITOR/TUNER key", a "VTR1/2/3 key", a "CD key", an "AMP key", a "DAT key" and an "OPTION key" among the mode changing over keys 3a and are thus used as an operating device for such corresponding electronic appliance. It is to be noted that the "OPTION key" is used for an electronic appliance which is arbitrarily determined as an electronic appliance to be controlled by a user of the remote commander, and operation keys necessary for various operations of such electronic appliance will also be arbitrarily set by the user.

Figure 5:
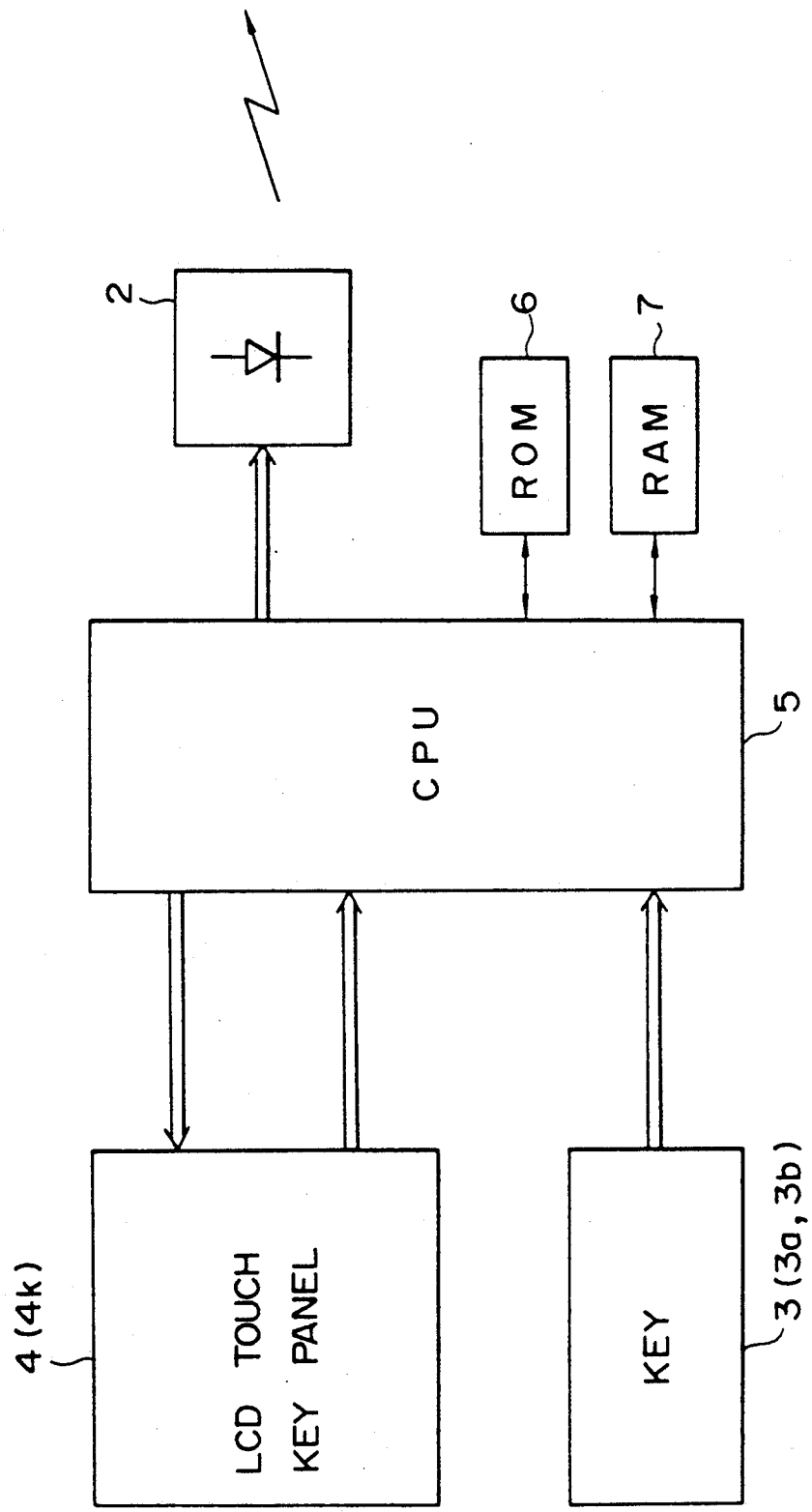
FIG. 5 is a block diagram of an electric circuit of the remote commander of FIG. 1.

An electronic circuit of the remote commander is shown in FIG. 5. Referring to FIG. 5, the remote commander includes a CPU (central processing unit) 5, a ROM (read only memory) 6 in which an operation program, command signal data for various electronic appliances and so forth are stored in advance, and a RAM (random access memory) 7 for temporarily storing therein data set, for example, by a learning function.

If an operation signal from an operation key 3b is inputted to the CPU 5, then the CPU 5 reads out a command signal corresponding to the thus depressed operation key 3b, that is, a command signal for an operation of a monitor television unit from the ROM 6 and supplies the command signal to the infrared ray sending section 2 so that a corresponding infrared ray signal may be sent out from the infrared rays sending section 2.

When an operation is performed in accordance with operation key displays on the touch panel operating section 4, the operation key depressed is detected by the transparent switch section 4b, and a corresponding operation detection signal is supplied from the transparent switch section 4b to the CPU 5. The CPU 5 thus reads out a command signal corresponding to the depressed operation key 4k in a mode of an electronic appliance then from the ROM 6 and causes the infrared ray sending section 2 to send out a corresponding infrared ray command signal in a similar manner as in the case of depression of an operation key 3b.

On the other hand, in case an operation signal from a mode designating key 3a is inputted to the CPU 5, the CPU 5 reads out display data for a mode of an electronic appliance designated by the mode designating key 3a from the ROM 6 (from the RAM 7 when the depressed mode changing over key 3a is the "OPTION key") and controls displays of the touch panel operating section 4 in such a manner as described hereinabove with reference to FIG. 4. It is to be noted that, as displays are changed for each mode of an electronic appliance in this manner, command signals to be read out from the ROM 6 in response to selective depression of the operation keys 4 are also changed over, and also infrared ray command signals to be sent out from the remote commander are changed over to such signals that are effective only for an electric appliance which is an object of a mode of an electronic appliance then.

Accordingly, even if, for example, a "POWER key" of the touch panel operating section 4 in an MPD (multi-disk player) mode shown in FIG. 4(a) is depressed, power on/off control of any electronic appliance other than a multi-disk player will not take place.

While the romote commander of the present embodiment has such construction and performs such basic operation as described above, when an operation key 4k of the touch panel operating section 4 is depressed, the thus operated operation key is displayed in a flickering condition for several seconds after completion of such operation (after release of a finger from the touch panel) by control of the CPU 5.

Figure 6:
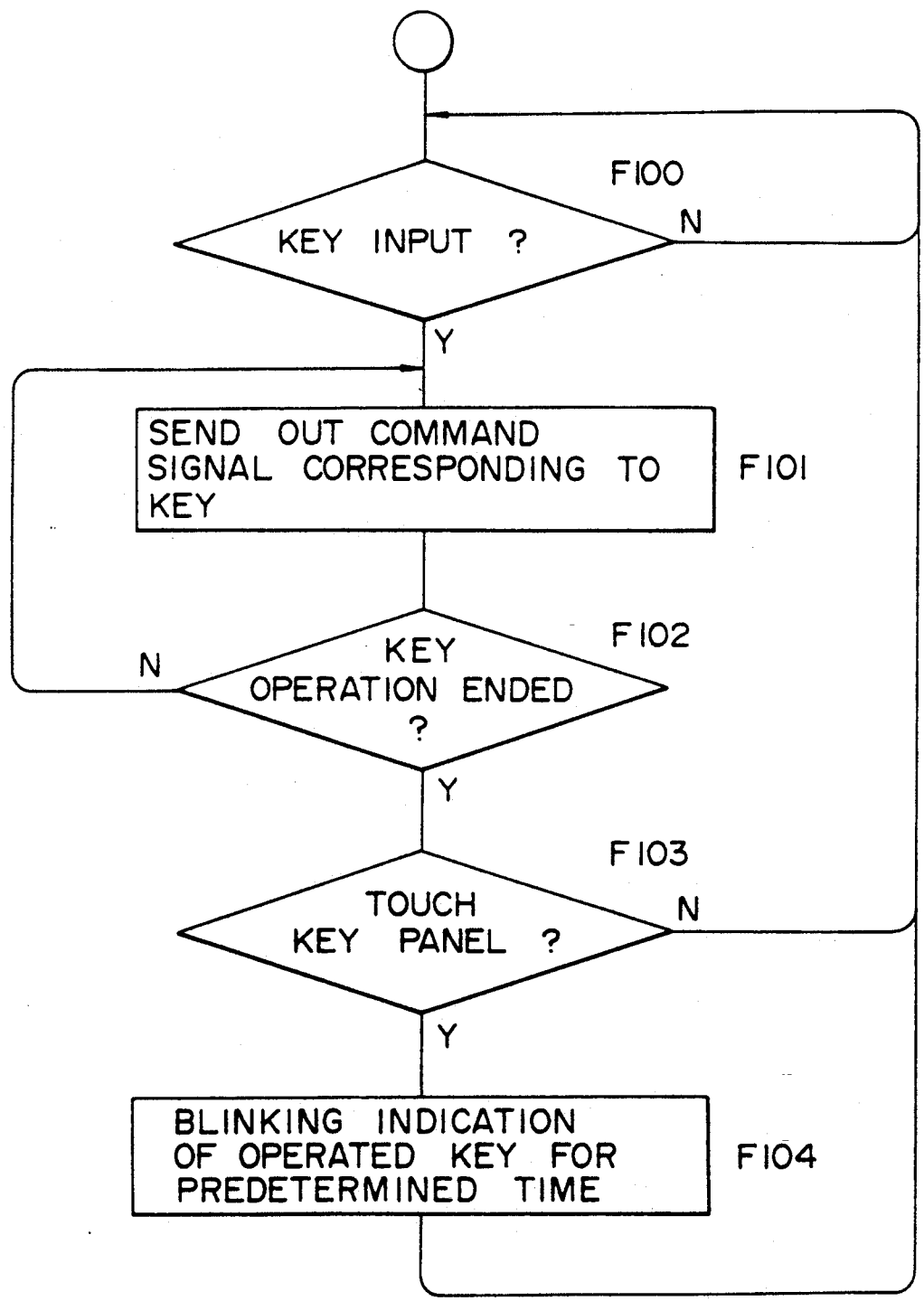
FIG. 6 is a flow chart illustrating operation of the remote commander of FIG. 1.

Controlling operation of the CPU 5 for sending out an infrared ray command signal including such control just above is illustrated in FIG. 6. It is to be noted that a flow of operation when a mode changing over key 3a is operated is omitted in FIG. 6.

Referring to FIG. 6, when it is detected first at step F100 that an operation key 3b or 4k is depressed, a command signal corresponding to the operated operation key 3b or 4k in a designated appliance mode then is outputted as infrared rays at step F101. In case the user continues to depress the operation key 4b or 4k, sending out of such infrared ray command signal is repeated at steps F102 and F101. When the finger is released from the operation key 3b or 4k, the CPU 5 ends such sending out of the infrared ray command signal and then waits a next key operation at steps F103 and F100. Then, in case it is judged at step F103 that the operated operation key is an operation key 4k of the touch panel operating section 4, the CPU 5 causes, at step F104, a display of a display portion in the frame of the operated operation key 4k to flicker for several seconds after completion of the operation of the operation key 4k.

Since such control as described just above is executed, it can be confirmed which one of operation keys of the touch panel operating section 4 has been depressed. Accordingly, while an operation of a key in error likely takes place even with such touch panel, even if an object electronic appliance operates in a different manner from what the user originally wanted as a result of such erroneous key operation, the user can confirm it from a flickering display that an operation in error has been done, and consequently, the user can perform a correct operation.

It is to be noted that not only a display portion in the frame of an operation key but also the frame may be caused to flicker upon display.

Further, construction of the touch panel operating section 4, kinds, numbers and an arrangement of the operation keys 3b and 4k and mode changing over keys 3a and so forth are not limited to those of the remote commander of the embodiment described above, and the present invention can be applied to any electronic appliance in addition to audio/visual appliances.

Having now fully described the invention, it will be apparent to one of ordinary skill in the art that many changes and modifications can be made thereto without departing from the spirit and scope of the invention as set forth herein.

What is claimed is:

1. A wireless, hand-held remote commander for controlling remotely located electronic appliances, comprising: a touch panel operating section including a plurality of operation keys that are actuated by touching and display means for displaying an image of said plurality of operation keys thereon and an operation detecting means for detecting, when one of said operation keys displayed on said display means is touched, the touched operation key causing signal sending means to send out a signal corresponding to the touched operation key detected by said operation detecting means to a remotely located appliance, and controlling means responsive to detection of the touched operation key by said operation detecting means for controlling said display means to display to a user of the remote commander an image of the touched operation key in a flashing light condition for a predetermined period of time after completion of touching the operation key.

2. A remote commander according to claim 1, wherein said signal sending means comprises an infrared ray transmitter controlled by a central processing unit arranged within said hand-held remote commander.

* * * * *